US012805265B2

(12) United States Patent
Geissler et al.

(10) Patent No.: US 12,805,265 B2
(45) Date of Patent: Nov. 17, 2026

(54) METHOD FOR PRODUCING A VACUUM GRIPPER FOR SEMICONDUCTOR WORKPIECES, AND VACUUM GRIPPER

(71) Applicant: SILTRONIC AG, Munich (DE)

(72) Inventors: Sebastian Geissler, Brand-Erbisdorf (DE); Ludwig Lamprecht, Truchtlaching (DE)

(73) Assignee: SILTRONIC AG, Munich (DE)

( * ) Notice: Subject to any disclaimer, the term of this patent is extended or adjusted under 35 U.S.C. 154(b) by 747 days.

(21) Appl. No.: 18/019,109

(22) PCT Filed: Jul. 21, 2021

(86) PCT No.: PCT/EP2021/070436

§ 371 (c)(1),
(2) Date: Feb. 1, 2023

(87) PCT Pub. No.: WO2022/037890

PCT Pub. Date: Feb. 24, 2022

(65) Prior Publication Data

US 2023/0278111 A1 Sep. 7, 2023

(30) Foreign Application Priority Data

Aug. 18, 2020 (EP) .................................... 20191459

(51) Int. Cl.

| | |
|---|---|
| ***H10P 72/78*** | (2026.01) |
| ***B33Y 10/00*** | (2015.01) |
| ***B33Y 40/20*** | (2020.01) |
| *B33Y 80/00* | (2015.01) |

(52) U.S. Cl.
CPC .............. *H10P 72/78* (2026.01); *B33Y 10/00* (2014.12); *B33Y 40/20* (2020.01); *B33Y 80/00* (2014.12)

(58) Field of Classification Search
CPC ... H01L 21/6838; H01L 21/683; B33Y 10/00; B22F 10/20; B22F 10/22; B22F 10/25; B22F 10/66; H10P 72/78; H10P 72/04; H10P 72/70
See application file for complete search history.

(56) References Cited

U.S. PATENT DOCUMENTS 7,927,096 B2 * 4/2011 Fukumoto ............. B25B 11/005 432/259
10,707,652 B1 7/2020 Tazzoli et al.
2015/0108095 A1 * 4/2015 Kruer ..................... B23K 9/167 219/76.14
2016/0181142 A1 6/2016 Raj et al.
(Continued)

FOREIGN PATENT DOCUMENTS

CN 105185725 A 12/2015
JP 2016092239 A 5/2016
(Continued)

*Primary Examiner* — Michael P Wieczorek
(74) *Attorney, Agent, or Firm* — Brooks Kushman P.C.

(57) ABSTRACT

A vacuum gripper for semiconductor workpieces is produced from at least one base material by means of an additive manufacturing method such as 3D printing. The method may also include printing various other feature of the vacuum gripper such as reinforcing structures and or seals. The gripper may include a plurality of suction openings and corresponding channels for providing a negative pressure when cooperating with a vacuum.

13 Claims, 8 Drawing Sheets

(56) References Cited

U.S. PATENT DOCUMENTS

| | | | |
|---|---|---|---|
| 2017/0345692 | A1 | 11/2017 | Liu et al. |
| 2017/0345700 | A1* | 11/2017 | Oremus .................. H10P 72/78 |
| 2018/0005863 | A1 | 1/2018 | Chavez-Clemente et al. |
| 2018/0178290 | A1* | 6/2018 | Urata ........................ B22F 3/24 |
| 2018/0178555 | A1 | 6/2018 | Van Vliembergen et al. |
| 2018/0259855 | A1 | 9/2018 | Roset et al. |
| 2019/0080954 | A1 | 3/2019 | Kim et al. |
| 2019/0272982 | A1 | 9/2019 | Hawrylchak et al. |
| 2020/0009702 | A1* | 1/2020 | Cheng ..................... B24B 29/02 |
| 2023/0010049 | A1* | 1/2023 | Vellanki .............. H10P 72/0432 |

FOREIGN PATENT DOCUMENTS

| | | | |
|---|---|---|---|
| JP | 2017121806 | A | 7/2017 |
| JP | 2019007479 | A | 1/2019 |
| JP | 2019016700 | A | 1/2019 |
| KR | 20000008837 | U | 5/2000 |
| KR | 20200029655 | A | 3/2020 |
| TW | 202020958 | A | 6/2020 |
| WO | 2017161052 | A1 | 9/2017 |
| WO | 2017184223 | A1 | 10/2017 |

* cited by examiner

METHOD FOR PRODUCING A VACUUM GRIPPER FOR SEMICONDUCTOR WORKPIECES, AND VACUUM GRIPPER

CROSS-REFERENCE TO RELATED APPLICATIONS

This application is the U.S. National Phase of PCT Application No. PCT/EP2021/070436 filed on Jul. 21, 2021, which claim priority to EP20191459.5 filed on Aug. 18, 2020, the disclosures of which are hereby incorporated by reference in their entirety.

BACKGROUND

1. Field of the Invention

The present invention relates to a method for producing a vacuum gripper for semiconductor workpieces and to such a vacuum gripper for semiconductor 5 workpieces.

2. Description of Related Art

Vacuum grippers (often also referred to as "chucks," suction grippers, or vacuum suction grippers) are used in the production and processing of semiconductor workpieces such as e.g. wafers of silicon or other semiconductor materials in order to be able to secure and/or transport these semiconductor workpieces during various process steps and/or hold them in a specific alignment. At the same time, however, the semiconductor workpieces are also processed when they are arranged or held on a vacuum gripper. This includes e.g. polishing, etching, cleaning, dimensioning and grinding the surfaces.

Such vacuum grippers for semiconductor workpieces may be manufactured as devices which have been cast, welded and processed by machining processes. These manufacturing processes only allow a restricted implementation of the shaping and functional features of the vacuum grippers.

US 2019/272982 A1 thus discloses a method for producing a vacuum gripper for semiconductor workpieces, in which the vacuum gripper is created from at least one base material by means of an additive build-up process.

US 2019/080954 A1 discloses a device for retaining a semiconductor wafer using vacuum.

US 2017/345692 A1 also discloses a device for holding a semiconductor wafer using vacuum, which device was produced by means of 3D printing.

There is therefore a need for improved vacuum grippers for semiconductor workpieces and/or the production thereof.

SUMMARY OF THE INVENTION

A method for producing a device to retain a semiconductor using a vacuum, wherein the method includes printing a substantially flat region configured to receive a semiconductor workpiece from a base material, adding a reinforcing structure arranged to support the substantially flat region, and arranging one or more seals on the base material to contact the semiconductor workpiece when received. The substantially flat region defining one or more suction openings and one or more channels in communication with the one or more suction openings. The one or more suction openings and one or more channels may cooperate to apply a negative pressure through the one or more suction opening when connected to a negative pressure source such as the vacuum.

DETAILED DESCRIPTION OF PREFERRED EMBODIMENTS

Figure 1:
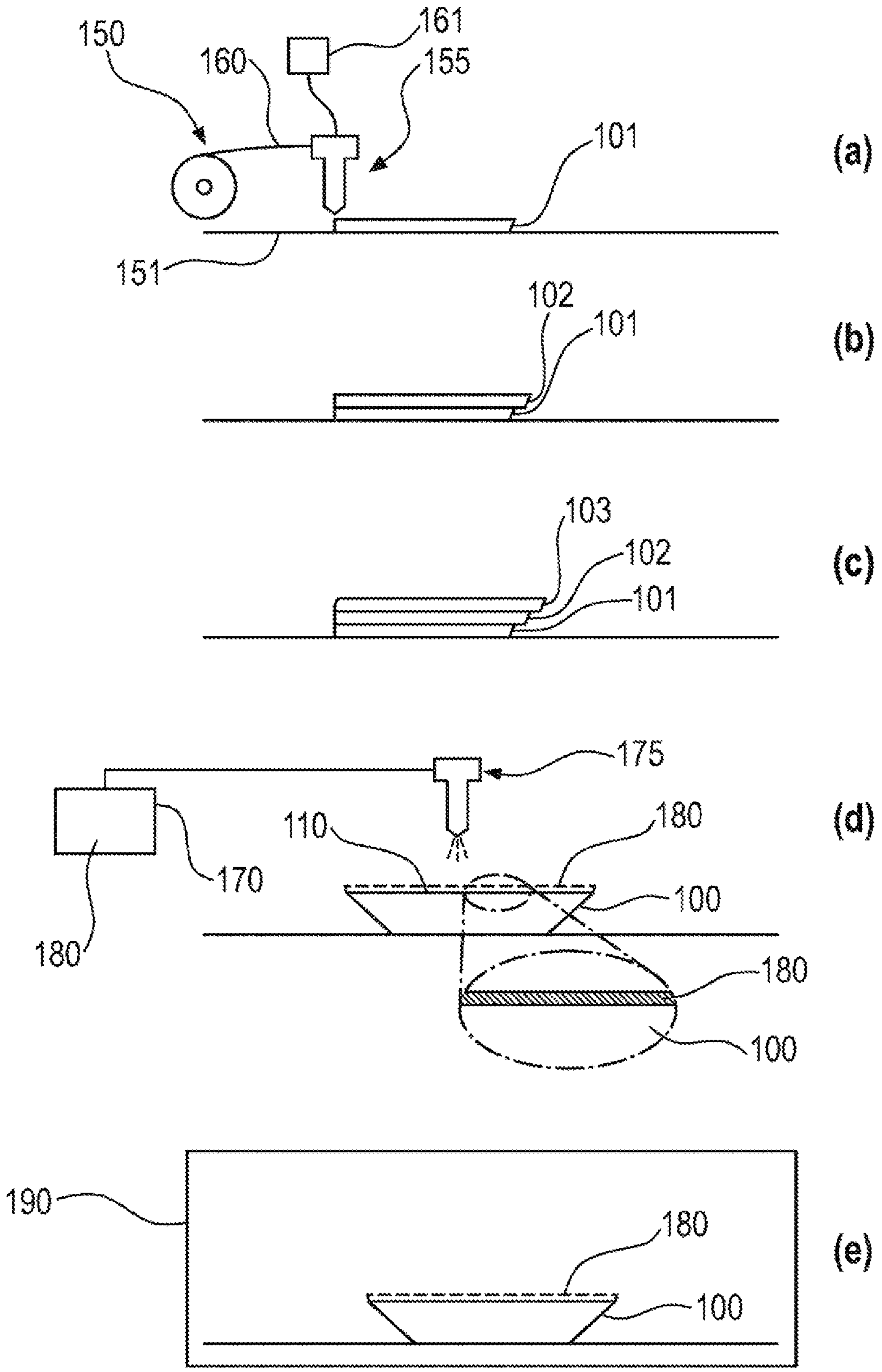
FIG. 1 shows a schematic of a procedure in a method according to the invention in a preferred embodiment.

According to the invention a method for producing a device suitable for retaining a semiconductor workpiece by means of vacuum. Advantageous embodiments are subjects of the dependent claims and of the description which follows.

The invention is concerned with the production of a vacuum gripper for semiconductor workpieces such as e.g. silicon wafers, and the structural design thereof. As also already mentioned at the outset, a vacuum gripper is a device by means of which a semiconductor workpiece, in particular a wafer, can be retained securely. For this purpose—as the name already states—a vacuum is generated by means of which the semiconductor workpiece can be sucked onto the vacuum gripper.

Such a vacuum gripper preferably has an (at least substantially) flat area, on which a semiconductor workpiece can be arranged, one or more suction openings and one or more channels connected thereto. The channels should correspondingly be connected to the suction openings. The suction openings should be provided as far as possible in the region of the flat area such that the semiconductor workpiece can be positioned thereon. Moreover, the channels should be able to be connected or have been connected to a negative pressure source, in order to be able to create a negative pressure—or a vacuum—in the channels. The flat area may have e.g. a round form, so that typical wafers can be placed thereon. A diameter of this round area or of the entire vacuum gripper can then be e.g. 300 mm or even more.

In the proposed method, a vacuum gripper is created from at least one base material by means of an additive build-up or production process in or with a predefined form such as by 3D printing. The base material is thus e.g. joined together layer by layer, until ultimately the desired, predefined form is produced. In this respect, the vacuum gripper is preferably designed in such a way that it has the at least substantially flat area, one or more suction openings, and one or more channels connected thereto, as have already been explained above as expedient embodiments of a vacuum gripper.

The vacuum gripper is preferably moreover designed in such a way that it comprises reinforcing structures, which are formed in particular from the base material. The creation of such reinforcing structures such as e.g. struts, thickened portions and the like may be made by means of the additive build-up process or by means of 3D printing in a particularly simple manner and also in or with more or less any desired form. However, reinforcing structures may also be formed from another material, which has e.g. a different material hardness to the base material.

At least one additive, by means of which the material hardness can be adapted, is preferably added to the base material. In this way it is possible—similarly to the reinforcing structures—to influence the mechanical properties of the vacuum gripper in a targeted manner, in particular also selectively at specific points or in specific regions, e.g. also for the formation of the reinforcing structures.

Similarly, it is expedient when predefined regions of the vacuum gripper are created from a different material to the base material by means of the additive build-up process. In this way, it is possible to produce e.g. flexible regions, which function e.g. as a seal.

In this context, it is similarly preferred if a layer with a material with lower hardness or a lower degree of hardness than the base material is formed on that area or side of the vacuum gripper which is to face the semiconductor workpiece. This layer may then comprise the flat area. This layer may then serve to avoid possible damage to the semiconductor workpiece and thus serve as a replacement for what is known as a "chuck pad". Such a "chuck pad" is conventionally a kind of section of fabric or textile, if appropriate also composed of polyurethane, which is placed onto the hard surface in conventional vacuum grippers, in order to avoid damage to the semiconductor workpiece. Such a chuck pad is no longer necessary in the design of the layer described herein.

Then, after the vacuum gripper has been produced with the predefined form from the base material or optionally the further materials, it is possible to apply, completely or in predetermined regions of a surface of the body (built up in this way), a coating material for protection against chemicals, i.e. the vacuum gripper is rendered resistant to chemicals by means of a coating (which serves as a protective layer) and reduces the surface roughness. The regions relevant in this respect of the surface to which the coating material is applied are in particular those regions which later, during use, come into contact with corresponding media or chemicals and therefore should be protected. This concerns in particular a top side (in particular the flat area already mentioned), which serves to suction the semiconductor workpieces. In this respect, preferred coating materials are polytetrafluoroethylene, PTFE, perfluoroalkoxy polymer, PFA, polyvinylidene fluoride, PVDF, DLC (diamond-like carbon) or silicon carbide.

The reason for the preferred use of such a coating is that in the case of components produced by means of an additive build-up process, such as 3D printing, as well as the vacuum gripper mentioned composed (possibly only) of the base material—depending on the desired application—the roughness of the surfaces may be too strongly pronounced, i.e. the surfaces generally have too great a roughness for the desired use. As a result, organic and inorganic contaminants (which are produced e.g. when the semiconductor workpiece held by the vacuum gripper is being polished) are deposited in and on the surfaces, which under certain circumstances adversely affect the quality of the semiconductor workpieces to be processed.

The coating with e.g. PTFE on the relevant surfaces of a vacuum gripper produced by means of an additive build-up process now makes it possible, however, to combine the positive properties of a conventionally produced vacuum gripper (that is to say, in particular the resistance to chemicals) with the positive properties of a vacuum gripper produced by means of an additive build-up process for silicon wafers (i.e. in particular the free shaping).

A vacuum gripper produced by means of an additive build-up process would deform as a result of high thermal loads such as in the case of conventional coating processes, it is possible to use a low-temperature coating process in combination with the additive build-up process in a targeted manner. The high-purity coatings (i.e. coatings of particularly high purity) required for the processes in the case of semiconductor workpieces are conventionally applied to surfaces at high temperatures.

A low-temperature coating process used in a targeted manner, preferably at a temperature below 150° C., makes it possible to apply high-purity coatings even to the less thermally stable surfaces of e.g. 3D printed components such as the vacuum grippers described herein. Thus, a low-temperature high purity coating brings together the advantages such as free shaping, targeted positioning of suction openings, and the chemical and physical properties. The material PA 3200GF has a heat distortion temperature (at a pressure of 0.45 MPa and in the X direction) of at most 157° C. in accordance with, for example, ISO 75-1/-2. A comparable situation applies for the preferred base materials, which comprise a polyamide, in particular filled with glass beads. If this temperature is exceeded, the plastic contour typically collapses in on itself. PTFE coatings e.g. are generally molded on and sintered in an oven at a temperature of approximately 220° C. to 420° C. A low-temperature sintering process, which extends typically over a relatively long period of time at e.g. 100° C., has made it possible to achieve a situation in which a 3D printed vacuum gripper for silicon wafers is rendered resistant to chemicals and dirt.

A surface roughness of the vacuum grippers produced by means of an additive buildup process can be reduced by low-temperature coatings, the $R_z$ and $R_a$ values (which specify the roughness) are typically reduced by approx. 70% in relation to the corresponding values of the vacuum gripper without the low-temperature coating. This thus also makes a contribution to particles or other organic or inorganic constituents of the liquids on the vacuum gripper adhering to the surfaces (of the vacuum gripper) to a much smaller extent and thus being able to be removed in a much easier and targeted manner.

By means of an additive build-up process or by means of 3D printing, it is possible to produce vacuum grippers optimized in a wide variety of respects compared to conventional production processes. Improved shaping, i.e. the actually producible form, makes it possible to achieve an optimal form better than with conventional production processes. For example, the actively effective suction openings, which may be in the form of suction funnels, can be adapted to the respectively desired application by contrast with conventionally manufactured vacuum grippers. The free shaping makes it possible to set the required holding force created by the vacuum or the negative pressure in a particularly accurate manner. The region (channels) to be evacuated can be kept as small as possible by virtue of the application-optimized and variable shaping, this contributing to a faster buildup and degradation of the holding forces and as a result accelerating e.g. the transfer of the semiconductor workpieces.

By contrast to conventional manufacturing processes, which are limited by the use of machining tools, by means of which e.g. thin, deep holes can be created only with a limited length, the additive production process makes it possible e.g. to produce a vacuum reservoir directly in the vacuum gripper, e.g. as a result of locally relatively large cross sections of the channels within the vacuum gripper. As a result, the vacuum gripper is less sensitive to temporary vacuum leakages and the risk of damage to the semiconductor workpieces if the holding force falls away during the surface processing is reduced. The individual design and arrangement of the suction openings and suction channels make it possible in comparison with conventional production processes to set the holding forces for the semiconductor workpieces in a targeted manner, e.g. in such a way that holding forces which are higher in the peripheral region during processing are set than in other regions (this involving a particular action of force on the workpiece edge).

The additive production process makes it possible to select the number of suction openings and channels depending on the region of the vacuum gripper in a targeted manner and thus to increase the number of suction openings and channels in the peripheral region e.g. over conventionally produced vacuum grippers, and in this way media, e.g. polishing agents, which are sucked on during the processing of the semiconductor workpieces can be extracted by suction more quickly. Instances of peripheral corrosion are thus avoided.

A shaping of the suction openings themselves, e.g. in the peripheral region, that can be designed in a targeted manner and adapted to the respective processing processes of the semiconductor workpieces is also made possible with the method proposed compared to conventional production processes. In the case of processes for processing the edges of the semiconductor workpieces, e.g. edge polishing, process media typically also pass into regions between the vacuum gripper and the semiconductor workpieces as a result of the action of force against the edge. A suction opening designed as an annular channel on the top side of the vacuum gripper makes it possible e.g. to quickly transport away the media which has penetrated and as a result to avoid unwanted chemical or physical reactions of the media on the surfaces of the semiconductor workpieces.

The use of the additive build-up process makes it possible, in comparison with the conventional production processes of vacuum grippers, to either directly integrate or subsequently attach e.g. even flexible seals, as already mentioned. The e.g. 3D printed sealing elements can—in comparison with conventional seals—be adapted precisely to the processing processes for the semiconductor workpieces, and thus prevent process media from penetrating in the edge region between the support area and the semiconductor workpiece, e.g. during edge polishing processes. The use of such vacuum grippers produced by means of an additive build-up process and having an integrated seal or separate seals which have, however, likewise been produced by means of an additive build-up process makes it possible to adapt the seals to changed processing processes for the semiconductor workpieces more variably and quickly than conventional production processes.

The targeted manufacture by means of additive build-up processes makes it possible to realize suction openings with any desired shaping, by contrast to conventional production processes. As a result, it is possible to avoid e.g. sharp-edged transitions, e.g. through radii instead of milled edges, with the suction openings and support areas, formed in any desired manner, of the semiconductor workpieces. In the case of conventionally produced vacuum grippers, the sharp-edged transitions are a significant cause of imprints, scratches or other damage to the surfaces of the semiconductor workpieces, since as a result of the evacuation the surface is pressed against the support area and sharp-edged transitions create imprints (what are known as "chuck marks") on the semiconductor workpiece or wafer on account of the high holding forces, which are necessary e.g. when the edge is being polished.

Compared to conventionally produced vacuum grippers, e.g. by machining processes, it is possible to realize e.g. optimized channels or channel guides and suction openings by means of an additive build-up process. This makes a contribution to maintaining a sufficient holding force between the vacuum gripper and the semiconductor workpiece in the event of time-limited vacuum leakages, which are produced e.g. on account of the polishing forces and the lifting of the edges of the semiconductor workpieces. Furthermore, an (as far as possible) homogeneous distribution of the forces acting during the process is achieved by virtue of the variable arrangement of active holding elements (i.e. the suction openings) on the top side or holding area of the vacuum gripper, and consequently the load to which the substrate is subjected is kept low with the system power remaining the same, and the risk of the semiconductor workpieces fracturing (wafer fracture) lowers considerably.

As already mentioned, the provision of a layer of material with a lower degree of hardness than the base material makes it possible to dispense with the use of what is known as a "chuck pad". If such a layer is not provided and/or the intention is nevertheless to use a "chuck pad", the production thereof can likewise be simplified. The reason for this is that, in the case of "chuck pads" for conventional vacuum grippers, annular cutouts are generally necessary, in order to be able to expose the suction openings provided in the vacuum gripper. The considerably more variable design of the suction openings in the vacuum gripper produced by means of an additive build-up process correspondingly also makes it possible to keep the cutouts in the "chuck pad" more simple, e.g. in the form of circular cutouts. In addition, it is also conceivable to produce a "chuck pad" itself by means of an additive build-up process.

Additive build-up processes or 3D printing allow—in particular compared to casting processes or machining processes used up to now—a freedom in terms of item numbers, an optimized use of material and lower tool costs. As a result, the production costs of the vacuum grippers are considerably lower compared to conventional production processes. A modification e.g. of underlying 3D CAD data for controlling the 3D printing can be sufficient to produce or print a modified design of the vacuum grippers, and additional instances of tool manufacturing, as in conventional production processes, e.g. casting models and special milling heads, are not necessary.

As already mentioned, an additive build-up process or 3D printing allows free shaping and as a result e.g. also a targeted mass distribution of the material or base material used for the purpose of the defined avoidance of vibrations, which otherwise might be caused e.g. by imbalances. A reduced use of material is also achieved while the mechanical stiffness remains the same, e.g. by the use of a honeycomb structure, mass-reducing struts instead of solid material and an FEM ("finite element method") generated design optimized for the respective application. Furthermore, the use of fillers for the targeted setting of mechanical properties can be taken into account. In this context, e.g. fiber proportions such as carbon fibers, glass fibers or ceramic fibers can preferably be used for the targeted setting of the stiffness, which may be different even within the vacuum gripper in the case of the additive build-up process. In this way, the vacuum gripper can be designed as e.g. more wear-resistant at mechanical fastening points than at the periphery.

As likewise already mentioned, additives can be used for the targeted adaptation of the material hardness, which can likewise be variably set in the case of additive buildup processes. As a result, e.g. specific regions of the vacuum gripper can be produced flexibly, e.g. as a seal, and other regions in turn e.g. can be produced as stronger and stiffer.

By contrast to conventional production processes, in the case of additive build-up processes or 3D printing different materials can be combined without joining technology, by means of which required properties determined for the respective application can be realized. This preferably makes it possible to obtain mechanisms of action by virtue of material combinations which can be realized only by additional actuators in the case of conventionally produced vacuum grippers. In the case of 3D printing processes, for example, the peripheral regions of the vacuum grippers can be produced with elastic and resilient materials, which better support the peripheral region when the edge is being polished.

In addition, an application-specific smoothing of particular regions such as e.g. the surfaces of the vacuum gripper can preferably be obtained by specific grinding processes, in particular by means of ultrasound and grinding additives, which expediently reduce the surface roughness on all surfaces of the vacuum gripper, even the internal channels. This leads to a reduced adhesion of media, e.g. polishing agents, on surfaces and thus to the avoidance of damage to the semiconductor workpieces.

The invention moreover relates to a vacuum gripper for semiconductor workpieces that is produced at least from a base material by means of an additive build-up process, in particular in or with a predefined form. In this respect, the vacuum gripper expediently has an at least substantially flat area on which a semiconductor workpiece can be arranged, one or more suction openings and one or more channels connected thereto. In this case, such a vacuum gripper is preferably produced by means of a method according to the invention. In terms of further preferred embodiments and advantages, to avoid repetition reference should be made to the above statements relating to the method, which apply correspondingly here.

Further advantages and embodiments of the invention will be apparent from the description and the appended drawing.

It will be appreciated that the features identified above and those still to be elucidated hereinafter can be used not only in the particular combination indicated but also in other combinations, or on their own, without departing from the scope of the present invention.

The invention is illustrated schematically in the drawing by an exemplary embodiment, and is described below with reference to the drawing.

FIG. 1 illustrates a schematic of a procedure in a method according to the invention in a preferred embodiment. For this purpose, illustrated as a rough schematic firstly in image (a) is a device 150 for an additive build-up process, e.g. a 3D printer, which has a printhead 155 to which a base material 160 is fed. Optionally, an additive 161 and/or another material (which in that case is used in particular separately from the base material) can also be fed to the printhead 155. The printhead 155 then firstly applies a first layer 101 of the vacuum gripper to be produced to a carrier 151.

In the further course of the procedure, further layers are applied, specifically by applying a respective new layer to the respective preceding layer. By way of example, shown in image (b) is a further layer 102, which is applied to the layer 101, and shown in image (c) is a further layer 103, which is applied to the layer 102.

In this way, the vacuum gripper 100 is produced from the base material by means of an additive build-up process in a desired or predefined form, as shown in a rough schematic in image (d). For more detailed views, reference should be made here to the subsequent figures. As likewise shown in image (d), a coating material 180 is applied e.g. to the top side of the vacuum gripper 100, for example by means of an application tool 175, to which the coating material 180 is fed from a tank 170.

The vacuum gripper 100 coated in this way is then dried, in particular sintered, e.g. in an oven 190, as shown in image (e), for a predetermined period of time within a predetermined temperature range which is below a heat distortion temperature of the base material 160, e.g. at 150° C. This results in a finished, coated vacuum gripper, which is thus also resistant to chemicals.

Figure 2:
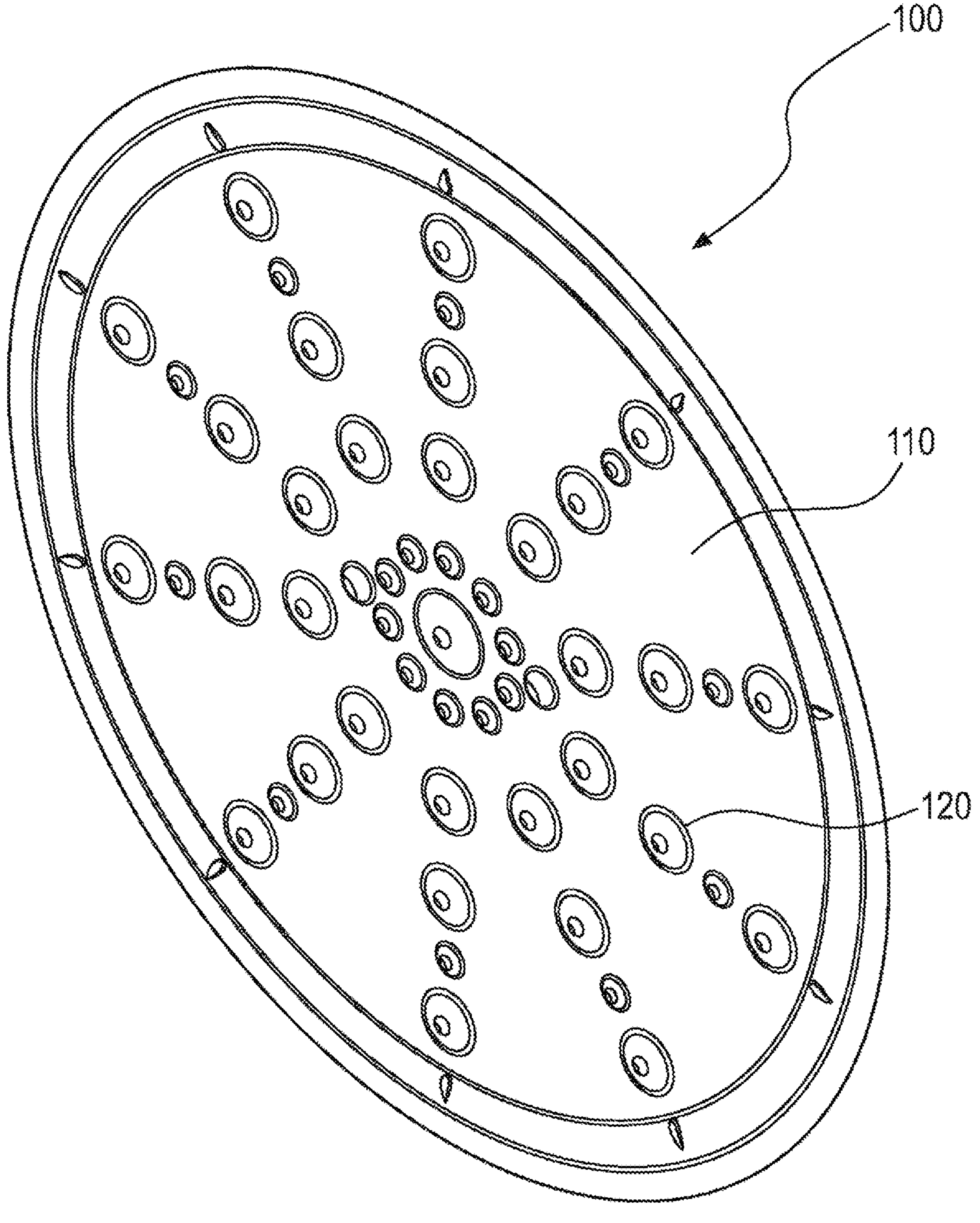
FIG. 2 shows a schematic of a vacuum gripper according to the invention in a preferred embodiment.
Figure 3:
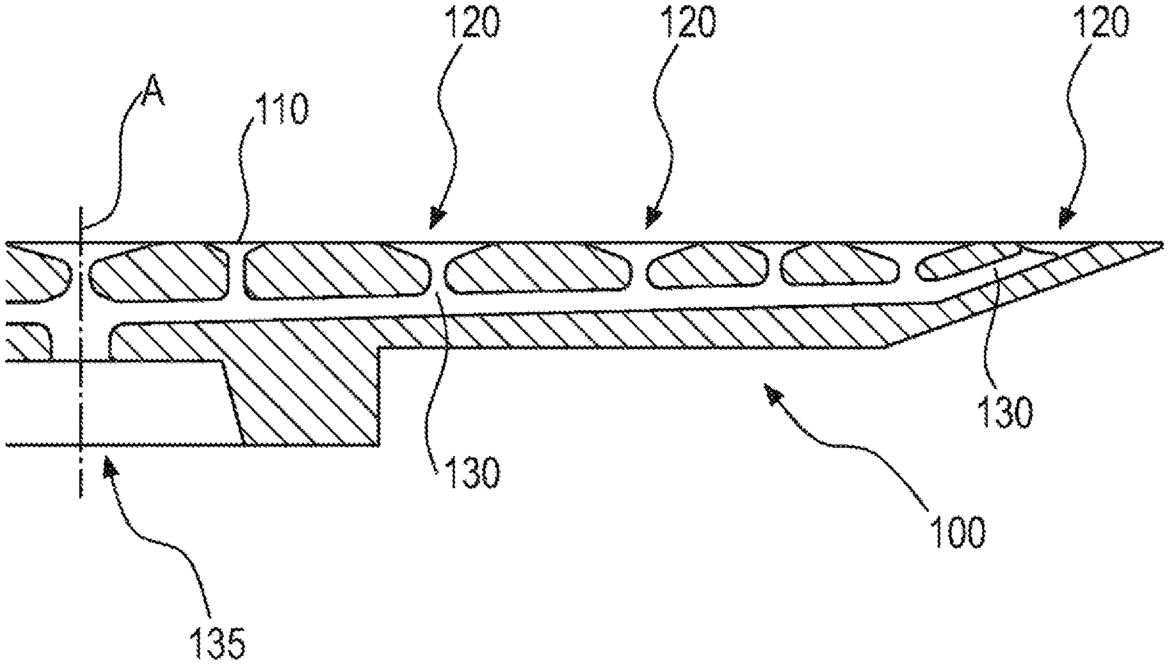
FIG. 3 shows the vacuum gripper from FIG. 2 in a sectional view.

FIG. 2 shows a schematic of a vacuum gripper 100 according to the invention in a preferred embodiment, as can be produced for example by means of the method shown in FIG. 1 and described with respect thereto. While FIG. 2 shows a perspective view of the top side of the vacuum gripper 100, FIG. 3 shows a matching sectional view. The axis of symmetry A shown in FIG. 3 runs through the central opening in the view in FIG. 2. FIGS. 2 and 3 are intended to be described comprehensively below.

The vacuum gripper 100 has a form which is round—with respect to the axis of symmetry A—with a top side which has—at least substantially—a flat area 110 or is designed as such a flat area. During use of the vacuum gripper 100, a semiconductor workpiece such as e.g. a wafer is placed—indirectly or directly—onto this flat area 110. In this respect, reference should also be made to FIG. 5.

A multiplicity of suction openings 120 are introduced on the top side of the vacuum gripper 100. While in FIG. 2 the—in particular uniform—distribution of these suction openings 120 can be seen on the top side or within the flat area 110, FIG. 3 shows the configuration within the vacuum gripper. Beginning from the top side, the suction openings 120 narrow approximately conically toward the inside of the vacuum gripper 100 and then open out into a channel 130. Each of the suction openings 120 may be attached to a channel 130, in particular the openings lying on a line in the radial direction being attached to a common channel 130. In this respect, reference should also be made to FIG. 7.

The channel 130 and also all further channels open out in the center or on the axis of symmetry A into an opening 135 which lies opposite the top side or flat area 110. There, e.g. a suitable apparatus may then be placed in order to generate a negative pressure or a vacuum, which propagates through the channels 130 as far as the suction openings 120. In this way, a negative pressure or a vacuum can be created at the suction openings 120, as a result of which a wafer bearing against the flat area 110 is sucked onto the flat area 110 or the vacuum gripper 100 and thus held in position.

Figure 4:
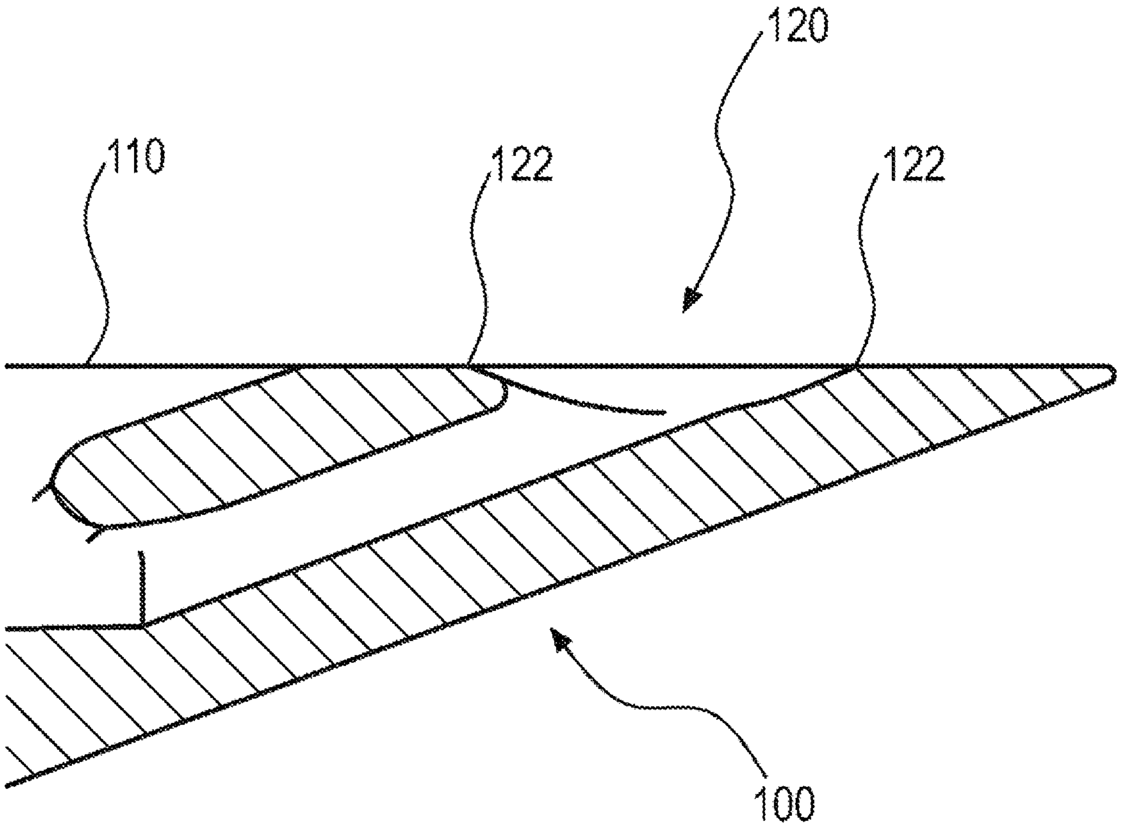
FIG. 4 shows an enlarged detail from FIG. 3.

FIG. 4 shows an enlarged detail of the vacuum gripper 100 from FIG. 3. On the basis of the example of the suction opening 120 placed rightmost, i.e. radially outermost, in that figure, the transitions 122 of the suction opening 120 at the transition to the flat area 110 are shown. It can be seen here that said transitions are not sharp edges—as would be the case in conventionally produced vacuum grippers—but rather have a round design or are designed as radii. These can be created particularly well or simply by means of an additive build-up process and result in the fact that no damage can occur to a wafer lying thereagainst or damage to a wafer lying thereagainst can be at least very considerably reduced.

Figure 5:
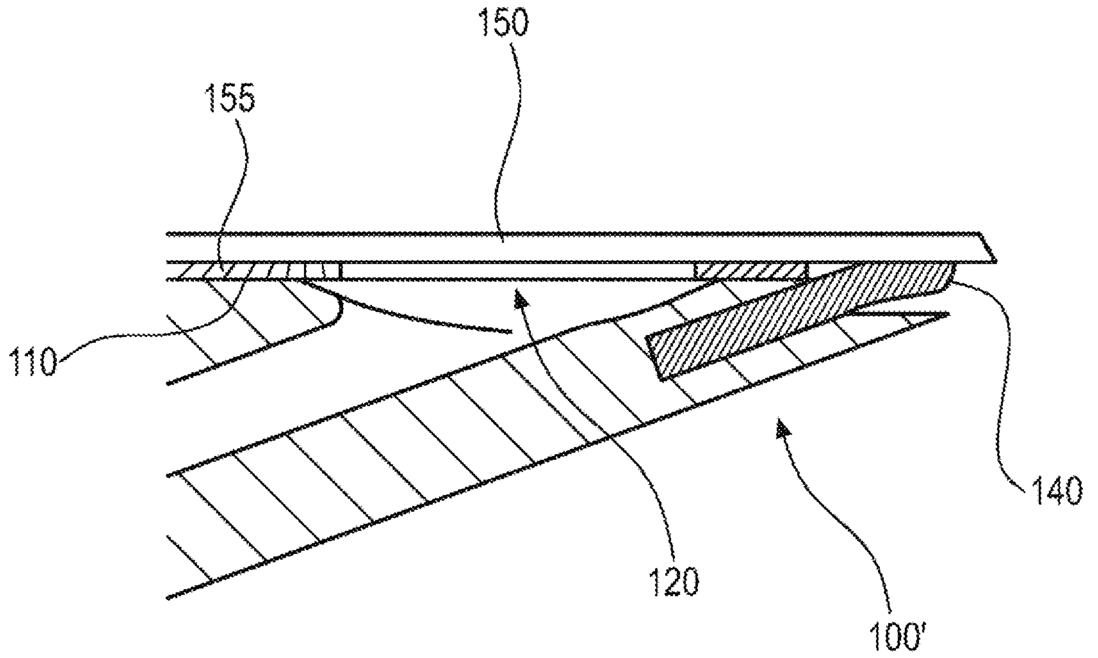
FIG. 5 shows a schematic of a vacuum gripper according to the invention in a further preferred embodiment.

FIG. 5 illustrates a schematic of a vacuum gripper 100' according to the invention in a further preferred embodiment. The vacuum gripper 100' corresponds fundamentally to the vacuum gripper 100 according to FIGS. 2, 3 and 4. The view shown here corresponds to the view shown in FIG. 4.

It can be seen here that a seal 140 is introduced at the radially outer end of the vacuum gripper 100'. Said seal may in particular be flexible and e.g. run in one or more sections around the periphery of the vacuum gripper. The seal 140 may be produced e.g. likewise by means of the additive build-up process, for which in that case, however, preferably another material is used as the base material.

Furthermore, a pad 155—or what is known as a “chuck pad”, on which in turn a semiconductor workpiece 150 in the form of a wafer is placed, is applied to or placed on the top side or the flat area 110. The suction openings and e.g. suitable openings in the pad 155 (one of which can be seen in the region of the suction opening 120) make it possible for the wafer 150 to be sucked on together with the pad 155. It can likewise be seen that the wafer 150 is in contact with the seal 140, as a result of which a seal is produced, and therefore the negative pressure can generate a greater effect.

Figure 6:
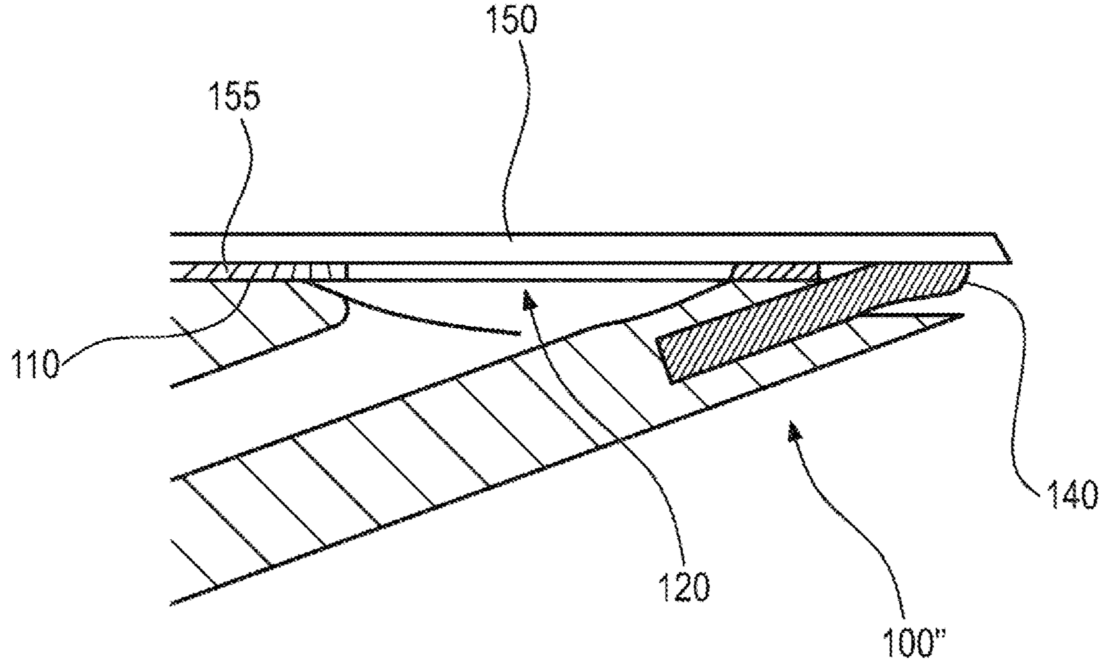
FIG. 6 shows a schematic of a vacuum gripper according to the invention in a further preferred embodiment.

FIG. 6 illustrates a schematic of a vacuum gripper 100" according to the invention in a further preferred embodiment. The vacuum gripper 100" corresponds fundamentally to the vacuum gripper 100' as illustrated e.g. in FIG. 5, however a layer 105 is formed on that side of the vacuum gripper which is to face the wafer 150 and serves as a “chuck pad”. A separate “chuck pad” is therefore not necessary.

Figure 7:
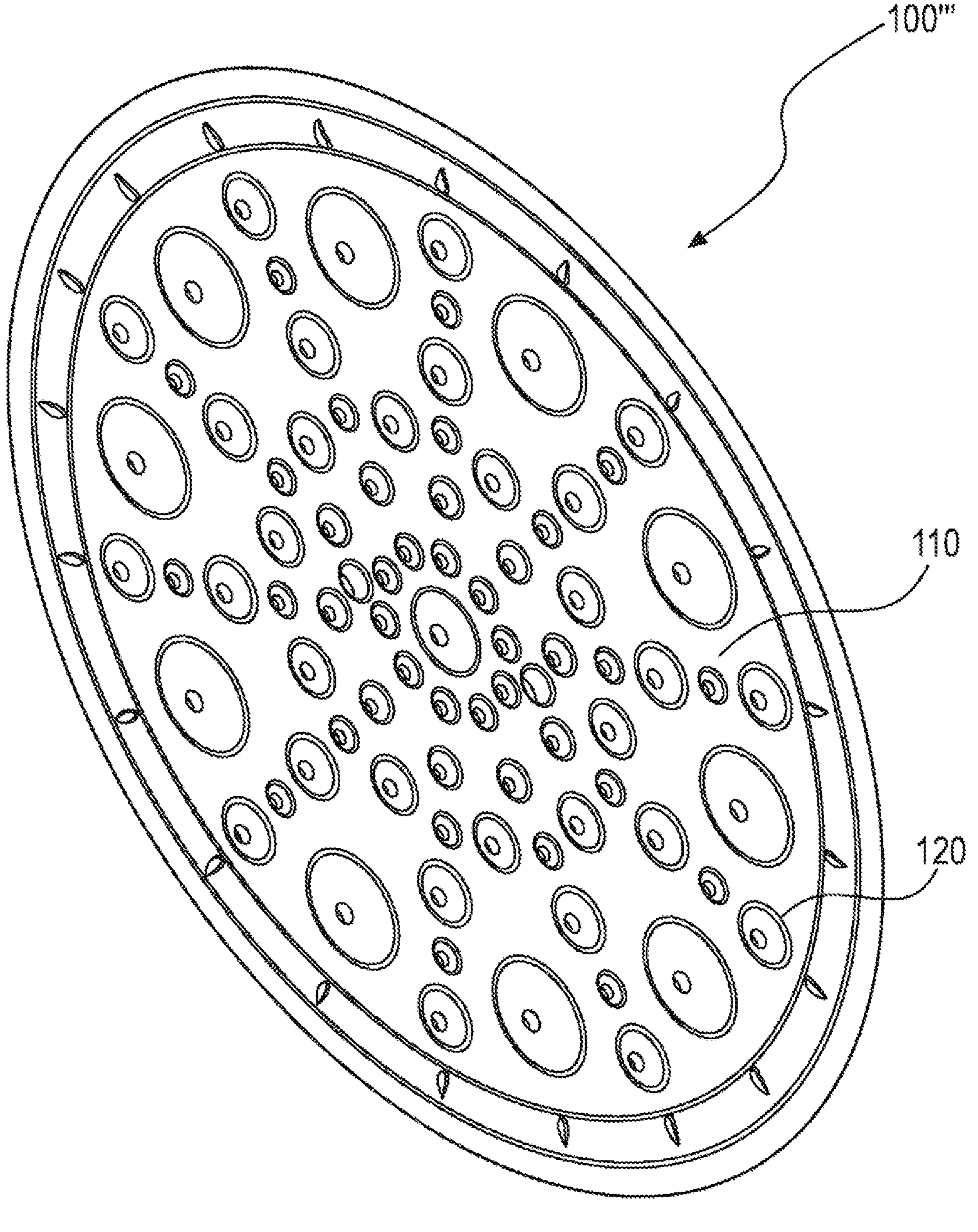
FIG. 7 shows the vacuum gripper from FIG. 6 in a different view.

FIG. 7 illustrates a schematic of a vacuum gripper 100''' according to the invention in a further preferred embodiment, specifically in a perspective view comparable to the view in FIG. 2. In this respect, the vacuum gripper 100'' corresponds fundamentally to the vacuum gripper 100 according to FIGS. 2, 3 and 4, however—as can be seen in comparison with FIG. 2—more suction openings 120 are provided. This shows that the suction openings 120 can be provided as required, in order thus e.g. to distribute the contact pressure created by the negative pressure at the suction openings as uniformly as possible onto the wafer or its surface area.

Figure 8:
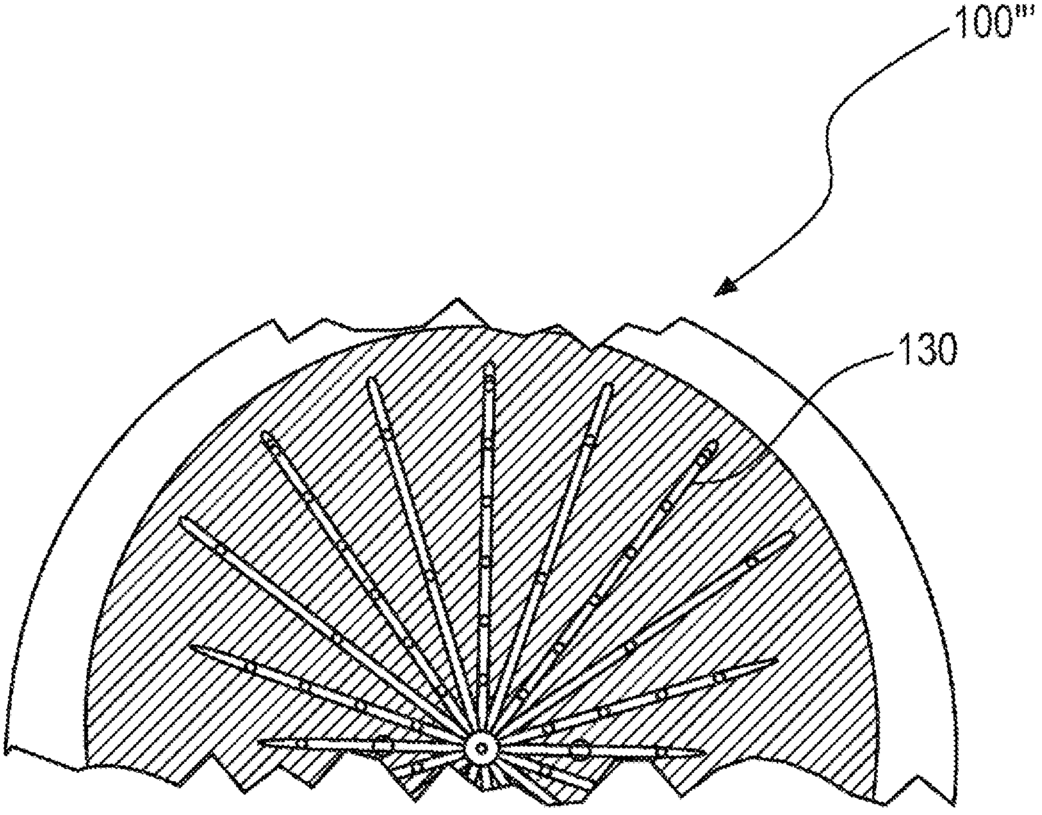
FIG. 8 shows a different view of the vacuum gripper shown in FIG. 7.

FIG. 8 shows the vacuum gripper 100''' from FIG. 7 in a different view, specifically with a section perpendicular to the axis of symmetry (which lies as in the case of the vacuum gripper according to FIG. 2). In this figure, shown by way of example are several channels 130, which run in a radial direction and coincide centrally in a star shaped manner. Each of the suction openings, as can be seen e.g. in FIG. 7, can be connected by means of these channels 130.

The invention claimed is:

1. A method for producing a device to retain a semiconductor wafer employing a vacuum comprising:

3D printing a substantially flat region configured to receive a semiconductor workpiece from a base material, the substantially flat region defining one or more suction openings and one or more channels in communication with the one or more suction openings, the one or more suction openings and one or more channels cooperating to apply a negative pressure through the one or more suction openings when connected to a negative pressure source;

adding a reinforcing structure arranged to support the substantially flat region, the reinforcing structure being 3D printed from a different material than the base material; and arranging one or more seals on the substantially flat region to contact the semiconductor workpiece when received.

2. The method of claim 1, further comprising applying a coating layer to a surface of the base material configured to receive the semiconductor workpiece, the coating layer including one or more of polytetrafluoroethylene, perfluoroalkoxy polymer, polyvinylidene fluoride, diamond-like carbon, and silicon carbide.

3. The method of claim 2, wherein the coating layer includes polytetrafluoroethylene.

4. The method of claim 1, further comprising applying a coating layer to a surface of the base material configured to receive the semiconductor workpiece, the coating layer being applied by a coating process below 150° C.

5. The method of claim 1, further comprising smoothing one or more predetermined regions by adding a grinding additive and ultrasound.

6. The method of claim 1, wherein the one or more seals are 3D printed from a material that is different than the base material and a reinforcing material of the reinforcing structure.

7. The method of claim 1, wherein the base material is 3D printed such that a round transition area exists between the substantially flat region and peripheral walls of the base material that define the one or more suction openings.

8. The method of claim 1, wherein a pad is applied to the substantially flat region such that the pad is disposed between the substantially flat region and the semiconductor workpiece when the semiconductor workpiece is received.

9. The method of claim 1, wherein the one or more suction openings are shaped as suction funnels.

10. The method of claim 9, wherein the suction funnels include round transitions.

11. The method of claim 1, wherein the one or more channels are in communication with a central opening configured to receive the negative pressure source.

12. The method of claim 1, wherein the base material is fed from a printhead.

13. The method of claim 1, wherein the base material comprises a polyamide filled with glass beads.

* * * * *